United States Patent [19]
Chu

[11] Patent Number: 5,448,125
[45] Date of Patent: Sep. 5, 1995

[54] SURFACE SKIMMING BULK WAVE GENERATION IN KTIOPO₄ AND ITS ANALOGS

[75] Inventor: David K. Chu, Wilmington, Del.

[73] Assignee: E. I. Du Pont de Nemours and Company, Wilmington, Del.

[21] Appl. No.: 266,276

[22] Filed: Jun. 27, 1994

[51] Int. Cl.⁶ ............................................. H01L 41/08
[52] U.S. Cl. .................................................. 310/313 A
[58] Field of Search ..................................... 310/313 A

[56] References Cited

U.S. PATENT DOCUMENTS

| | | | |
|---|---|---|---|
| 4,231,838 | 11/1980 | Gier ........................... | 156/600 |
| 4,541,687 | 9/1985 | Brooks ....................... | 350/162.12 |
| 4,965,479 | 10/1990 | Elliott ......................... | 310/313 D |
| 5,003,822 | 4/1991 | Joshi ........................... | 73/204.23 |
| 5,066,356 | 11/1991 | Ferretti et al. ............. | 156/623 R |
| 5,130,257 | 7/1992 | Baer et al. .................. | 436/151 |
| 5,334,960 | 8/1994 | Penunuri .................... | 333/193 |
| 5,350,961 | 9/1994 | Chu ............................. | 310/313 A |
| 5,365,138 | 11/1994 | Saw et al. ................... | 310/313 D |

FOREIGN PATENT DOCUMENTS

WO94/03972  2/1994  WIPO ........................... H03H 9/02

OTHER PUBLICATIONS

Buritskii, K. S. et al, *Electronics Letters*, 27(21), 1896–1897, Oct. 10, 1991.
Colmenares, N. J., *IEEE Spectrum*, pp. 39–46 (May 1994).
Andle, J. C. et al, *Sensors and Actuators B*, 8, 191–198 (1992).
Nomura, T. et al, *Japanese Journal of App. Physics*, 31 Supplement 31-1, 78–81 (1992) (Proceedings of 12th Symposium on Ultrasonic Electronics, Tokyo 1991).
Chu, D. T., (Doctoral Dissertation) "Piezoelectric and Acoustic Properties of Potassium Titanyl Phosphate (KTP) and Its Isomorphs", Dec. 1991, pp. 57–64.
Smith, H. I., *Acoustic Surface Waves*, Oliner, A. A., Ed., 305–323, Springer-Verlag Berlin Heidelberg New York (1978).
White, R. M., et al, *Applied Physics Letters*, 7(12), 314–315 (Dec. 15, 1965).
Lewis, M. et al, 1977 Ultrasonics Symp. Proceedings, IEEE Cat. #77CH1264-1SU, pp. 744–752.
Tseng, C.-C, *Applied Physics Letters*, 16(6), 253–255 (Mar. 15, 1970).
Bleustein, J. L., *Applied Physics Letters*, 13(12), 412–413 (Dec. 15, 1968).
Wagers, R. S. et al, *IEEE Transactions on Sonics and Ultrasonics*, SU-31(3), 168–174 (May 1984).
Kuhn, L., *Applied Physics Letters*, 17(6), 265–267 (Sep. 15, 1970).
Buritskii, K. S. et al, *Sov. Tech. Phys. Lett.*, 17(8), 563–565 (Aug. 1991).

*Primary Examiner*—Thomas M. Dougherty

[57] ABSTRACT

Devices are disclosed for controlling high frequency signals by the generation of surface skimming bulk waves (SSBWs). The devices include (a) a bulk crystalline substrate of MTiOXO₄ (M is K, Rb, Tl, Cs, and/or NH₄ and X is P and/or As) having mm2 crystal symmetry and a planar-cut surface, (b) an input interdigital transducer (IDT) deposited on a signal receiving area of the substrate surface, suitable for connection to a source of electric signal and for inverse piezoelectrically generating in-plane polarized surface skimming bulk waves having a velocity in the substrate of between about 4200 m/s and 7000 m/s, (c) a second IDT deposited on a signal sending area of the substrate surface suitable for piezoelectrically generating electric output signals from said surface skimming bulk waves, and (d) an electric signal responsive device which is operably connected to the second IDT and responds to the electric output signals. Also disclosed are a method of controlling frequency of electric signals which involves piezoelectrically converting the signals into SSBWs in a substrate of MTiOXO₄ and piezoelectrically detecting SSBWs from said substrate, and a method of fluid sensing which involves piezoelectrically converting input electric signals into SSBWs in a substrate of MTiOXO₄ in contact with the fluid and piezoelectrically detecting from the substrate SSBWs which have been transmitted past the fluid.

10 Claims, 2 Drawing Sheets

SURFACE SKIMMING BULK WAVE GENERATION IN KTiOPO₄ AND ITS ANALOGS

FIELD OF THE INVENTION

This invention relates to acoustic wave generation employing crystalline materials, and more particularly to acoustic wave generation employing KTiOPO₄ and analogs.

BACKGROUND OF THE INVENTION

Surface acoustic waves (i.e., "SAWs") also known, as Rayleigh waves, have been known since the middle of the nineteenth century. However, it was not until much later that the phenomenon of SAW propagation was first exploited for its applications to electronic devices. Acoustic wave devices known in the art commonly consist of a substrate on which a conductive material is deposited in a predetermined pattern. The patterned conductive material is known as an interdigital transducer (i.e., an IDT). R. M. White et al., Appl. Phys. Lett., Volume 7, Number 12, pages 314–316 (Dec. 15, 1965), describes the use of the IDT as an efficient technique for the generation and detection of surface acoustic waves on a piezoelectric surface. An IDT may be suitably connected to an electrical input so that the refractive index in a crystal is changed as required by acoustic-optic applications. See, e.g., K. S. Buritskii et al., Sov. Tech Phys. Lett. 17(8) pages 563–565 (1991) and L. Kunn et al., Appl. Phys. Lett. 17 (6) pages 265–267 (1970). In other applications, an IDT on one end of a substrate surface may be connected to a source of the frequency waves (e.g., television antenna—radio frequency) and an IDT on the other end of the substrate surface may be connected to a device designed to receive a predetermined frequency (e.g., radio frequency for a specific television channel). The design of the IDT (i.e., the pattern of the conductive materials on the surface of a particular type of substrate) determines how the frequency will be controlled (e.g., which channel is received).

The types of acoustic waves which may be generated in a given crystal depend upon the piezoelectric-elastic-dielectric (i.e., PED) matrix of the crystal, which in turn depends on the crystal structure. In other words, not all materials are suitable for SAW generation, and materials which are suitable for SAW generation may not be suitable for generation of other types of acoustic waves. The properties of the substrate (e.g., the crystal structure, axis on which the crystal is cut, propagation direction) will determine the type of acoustic wave that will be generated, mechanism of the control and how high a frequency can be controlled.

Radio frequency control devices using substrates capable of controlling the received radio frequency by the generation of SAWs are known in the art For example, R. S. Wagers et al., IEEE Transactions on Sonics and Ultrasonics, Vol. SU-31, No. 3, pages 168–174 (May 1984) discloses SAW devices based on lithium niobate. In these SAW devices the SAWs, generated by an IDT connected to a source of radio frequency waves, propagate through a y-cut lithium niobate crystal at a rate of about 3500 meters per second. This permits these SAW devices to be useful as radio frequency controllers in, for example, conventional television.

Acoustic waves, other than SAWs, may be generated in bulk crystal. For example, the Bleustein-Gulyaev wave (i.e., B-G wave) has been both mathematically postulated and experimentally proven to exist in crystals having 6 mm or mm 2 crystal symmetries (see e.g., J. L. Bleustein, Appl. Phys. Lett., Volume 13, Number 12, pages 412–413 (Dec. 15, 1968), and C.-C. Tseng, Appl. Phys. Lett. Volume 16, Number 6, Pages 253–255 (Mar. 15, 1970)); and surface skimming bulk waves (i.e., SSBWs) have been shown to propagate on the surface of the crystal and to gradually propagate partially into the depths of the crystal. Such waves (both SSBWs and B-G waves) generally propagate faster than conventional surface acoustic waves. SSBWs have been generated in lithium tantalate and lithium niobate at a rate of about 4100 meters per second and about 5100 meters per second, respectively (see Meirion Lewis et al., 1977 Ultrasonics Symposium Proceedings IEEE Cat#77CH1264-1SU pages 744–752). B-G waves have been found in $Bi_{12}GeO_{29}$ (i.e., "BGO") and $Ba_2NaNb_5O_{15}$ (i.e., "BNN") to possess velocities of 1694 m/sec and 3627 m/sec, respectively (see C.-C. Tseng, Appl. Phys. Lett. Volume 16, Number 6, Pages 253–255 (Mar. 15, 1970)).

Since potassium titanyl phosphate (i.e., "KTP") crystals are widely known to have a high nonlinear optical coefficients and resistance to optical damage, the SAW properties of rubidium exchanged KTP have been investigated relative to use in acousto-optic devices. K. S. Buritskii et al., Electronics Letters, Vol. 27, No. 21, pages 1896–1897 (Oct. 10, 1991), discusses the excitation of SAWs in Rb:KTP (i.e., a slab waveguide formed by Rb ion exchange on the surface of a single crystal of KTP). The velocity of the SAW generated in this waveguide was about 3900 meters per second. Buritskii et al., Sov. Tech. Phys. Lett., Volume 17, Number 8, pages 563–565 (August 1991) discusses the fabrication of a planar acousto-optic modulator using a Rb:KTP waveguide.

The effect of domain structure on SAW generation in KTP as well as the generation of B-G waves in KTP is disclosed in PCT International Publication No. WO 94/03972.

The number of devices requiring frequency control has grown in number and complexity, and the demand for controlling higher frequencies, such as those needed for microwave generators and high definition television, has grown commensurately. Recently, due to the growing number of cellular telephones in use, higher frequency ranges have been approved for use by cellular telephones, enhancing the need for devices which operate at high frequencies and at sufficiently high bandwidth to carry a large number of high frequency signals. See, e.g., N. J. Colmenares, IEEE Spectrum, pages 39–46 (May 1994). Moreover, for certain applications such as liquid sensing using acoustic devices, SAW waves are not considered adequate due to high loss of signal.

SUMMARY OF THE INVENTION

This invention involves the generation of surface skimming bulk waves (SSBWs) in a bulk crystalline substrate of MTiOXO₄, wherein M is selected from the group consisting of K, Rb, Tl, Cs, NH₄ and mixtures thereof and X is selected from the group consisting of P, As, and mixtures thereof, wherein the crystalline substrate of MTiOXO₄ (e.g., KTP) has mm 2 crystal symmetry. More particularly, this invention provides devices for controlling high frequency signals by the generation of surface skimming bulk waves comprising (a)

said bulk crystalline substrate of MTiOXO$_4$ having a planar-cut surface with a receiving area and a sending area; (b) an input interdigital transducer deposited on the signal receiving area of said substrate surface, suitable for connection to a source of electric signal and for inverse piezoelectrically generating in-plane polarized surface skimming bulk waves having a velocity within said bulk crystalline substrate of between about 4200 m/s and 7000 m/s; (c) a second interdigital transducer deposited on the signal sending area of said substrate surface suitable for piezoelectrically generating electric output signals from said surface skimming bulk waves; and (d) an electric signal responsive device which is operably connected to said second interdigital transducer and responds to said electric output signals.

This invention further provides a method of controlling the frequency of electric signals which comprises piezoelectrically converting said signals into said SSBWs in a substrate of MTiOXO$_4$ and piezoelectrically detecting said SSBWs from said substrate. This invention further provides a method of fluid sensing which comprises piezoelectrically converting input electric signals into said SSBWs in a substrate of MTiOXO$_4$ in contact with said fluid and detecting SSBWs from said substrate which have been transmitted past said fluid.

DETAILED DESCRIPTION

Figure 1:
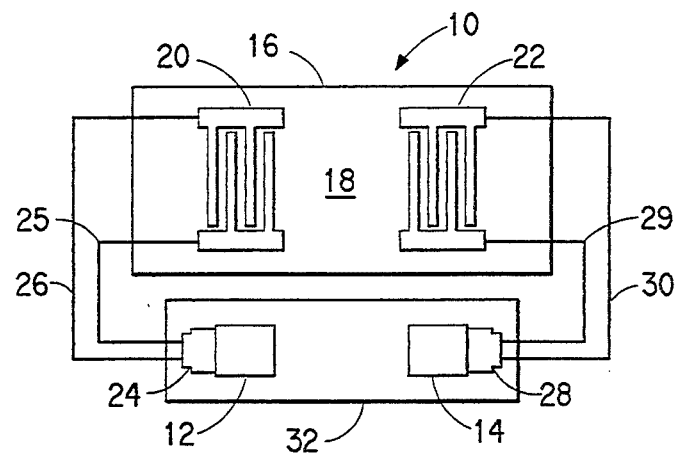
FIG. 1 is a schematic drawing of a frequency controlling device in accordance with the invention bulk crystalline MTiOXO$_4$.

A crystalline substrate of MTiOXO$_4$ (where M is K, Rb, Tl and/or NH$_4$, and X is P and/or As) suitable for use in the practice of this invention may be prepared in the mm 2 crystal symmetry by a variety of methods well known in the art. Two fundamental methods are commonly used; one, known as the hydrothermal method (see, e.g., U.S. Pat. No. 5,066,356) and the other, known as the flux method (see, e.g., U.S. Pat. No. 4,231,838). Of the many MTiOXO$_4$ analogues, KTiOPO$_4$ is preferred. The crystalline substrate can be in the form of a single crystal or crystalline thin film, so long as the crystal symmetry is mm 2. The crystalline substrate should have a planar cut such that the SSBWs may be propagated along the plane surface. For example, the crystalline substrate may be cut along the x-axis and the SSBWs can then be propagated in the z-direction. Bulk crystalline substrates of MTiOXO$_4$ such as KTP may be used for generating SSBWs having a wavelength related to the period of IDT used for acoustic wave generation.

The types of waves generated in the crystalline substrate are fundamentally determined by crystal structure. For example, SAW and B-G waves in bulk crystals can only be generated in certain crystal structures (e.g., mm 2 crystal symmetry common to z-cut MTiOXO$_4$). SAW can be generated directly on a z-cut MTiOXO$_4$ substrate without any ionic dopants such as rubidium. B-G waves can also be generated on x or y cut substrate with propagation along z axis. Because B-G waves are bulk acoustic waves, the bulk coupling coefficient (which is a material index of how efficient the material can convert the electrical energy into acoustic energy) of B-G waves can be very high (roughly about 20%, or about forty times the surface coupling coefficient of quartz), see D. K. T. Chu, Ph.D. dissertation, pages 57–64, Department of Electrical Engineering, University of Delaware (1991). Also as reported in this dissertation, the velocity is very high (reportedly about 4100 m/sec).

This invention involves the discovery that an even higher velocity, deeper penetrating acoustic wave can be generated in MTiOXO$_4$, when the crystal is planar-cut and the wave is propagated along the plane. For example, in KTP an SSBW is generated along the z-axis in the y-z plane at a velocity of about 6030 m/second (i.e., about 1.6 times as fast as SAW or B-G). The SSBW generated in accordance with this invention is characterized by deep penetration into the crystalline substrate and by an in-plane surface mode of vibration (i.e., the crystal lattice atoms vibrate in the same plane as the wave propagation direction). Consequently, the SSBWs generated in accordance with this invention exhibit a higher velocity and a much larger electromechanical coupling coefficient than either SAW or B-G. These devices are considered particularly suitable for frequency filtering and control in telecommunications, especially in the low microwave (e.g., 900 megahertz to 2400 megahertz) region. Moreover, because for SSBWs the vibration of the atoms in the crystal structure is in the plane of propagation (i.e., parallel to the surface of the substrate as opposed to perpendicular to it) when the surface of the vibrating crystal is contacted with a fluid, such as a vapor or liquid, the energy loss may be more readily correlated with in-plane surface effects of such contact. This characteristic makes the SSBW devices of this invention particularly suitable as piezoelectric substrates for liquid biological sensing applications. The deep crystal penetration of this SSBW also allows liquid sensing on the reverse side of thin (e.g., about 0.1 to 2 mm thick) crystalline substrates as well as on the same side that is in contact with the liquid.

Interdigital transducers can be deposited on the surface of the crystalline substrate by conventional lithographic techniques, such as those described by H. I. Smith, Acoustic Surface Waves, Fabrication Techniques for Surface Wave Devices, Pages 305–324, Springer-Verlag, Berlin Heidelberg, New York (1978). To develop the desired pattern onto MTiOXO$_4$ substrate one may use the following steps: (1) prepare the x-cut MTiOXO$_4$ substrate; (2) polish the substrate to provide a flatness better than half wavelength (typically about 0.3 $\mu$m flatness variation); (3) evaporate a conductive material, typically a metal film such as titanium about 1000 Å thick, onto the crystalline substrate using an electron beam evaporator; (4) spin a positive photoresist (e.g., a photopolymer) onto the substrate and softbake (prebake) at a suitable temperature and time period for the photoresist used; (5) align a predesigned photomask and expose it to light for a time sufficient to develop the desired resolution; (6) hardbake (postbake) for a suitable time and temperature for the photoresist used; (7) develop the exposed photoresist using a suitable developer; (8) etch the titanium off the area which has no photoresist cover; and (9) strip off unexposed photoresist using specified stripper (e.g., acetone). After all these processing steps, one can use a commercially available network analyzer such as Hewlett-Packard 8753C to analyze the performance of the devices. The pattern chosen for the IDT determines how the frequency is controlled. The operating frequency of an acoustic wave device is determined by the following equation: $f = v/\lambda$, where v is the velocity of the acoustic wave generated in the device by the IDT and $\lambda$ is the wavelength of the acoustic wave generated in the device by the IDT. Conventionally, the wavelength of the acoustic wave is determined by the IDT pattern. The smaller the width of the IDT "finger" in the direction of wave propagation, the smaller the wavelength of the acoustic wave generated in the device by the IDT, or the higher the operating frequency. However, there is a practical limit as to how small one can make the width of the IDT fingers due to the diffraction-free limit of the exposing sources such as UV light, electronic beam or X-ray. Consequently, the high velocity of the SSBWs of this invention allow one to make devices in a straight forward manner without the need for very very narrow IDT fingers. Moreover, the SSBWs employed in this invention are in-plane polarized waves; whereas bulk acoustic waves having velocities above about 7000 m/s normally propagate throughout the crystal thickness and have large out-of-plane propagation components. These waves with velocities above about 7000 m/s are thus less practical for reliably generating high frequency electrical signals.

The devices for controlling high frequency signals of this invention may, optionally include connectors to facilitate connection of the device to an electric signal source and/or an electric signal responsive device. The connections used between the interdigital transducers and either the high frequency signal or the signal responsive device are typically conventional conductive materials such as metal wires. For research purposes, a microwave probe head (Cascade Microtech SN17307, Cascade Microtech Inc., PO Box 1589, Beaverton, Ore. 97057-1589) can be used instead of wires to receive electrical signals generated from a network analyzer and then input the signals to the first IDT to excite SSBWs; and another probe head can be used on the signal end of the substrate surface to direct SSBWs to receive the output to the network analyzer to analyze the transmission properties of the device.

Suitable electric signal responsive devices for use in this invention include the frequency controlling component of cellular telephones, (e.g., those operating within bandwidths between about 900 and 2400 MHz). Another suitable electric signal response device is a monitor for SSBWs transmitted past fluids in contact with the substrate. Some general aspects of liquid sensing and biosensing applications are respectively provided in T. Nomura et al., Jap. J. Applied Physics, Vol. 31 (supp. 31-1) pages 78–81 (1992) and J. C. Andle et al., Sensors and Activators B, 8, pages 191–198 (1992).

FIG. 1 is a schematic illustration of a device (10) for frequency control in accordance with this invention. The device (10) is shown connected between a source at electric signal (12) and an electric signal responsive device (14). The frequency control device (10) includes a crystalline substrate of x-cut MTiOXO$_4$ (16) which has a surface (18) with a receiving end IDT (20) and a sending end IDT (22) deposited thereon. A connector (24) comprising lines (25) and (26) connects input IDT (20) to the signal source (12); and a connector (28) comprising lines (29) and (30) connects IDT (22) to the responding device (14). In operation, an electric signal from source (12) is transmitted through connector (24) to IDT (20) where SSBWs are generated. The SSBWs propagate through substrate (16) and are piezoelectrically detected by IDT (22). The electric signal produced at IDT (22) is transmitted through connector (28) to the responding device (14). In practice, the signal source (12) and the responding device (14) are normally included within a single unit (32).

Figure 2:
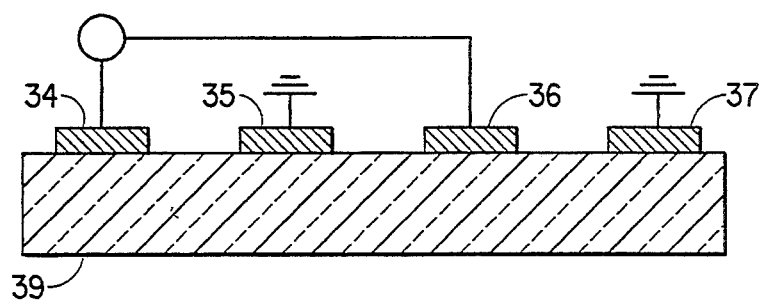
FIG. 2 is a schematic cross-sectional drawing through an IDT and substrate of a frequency controlling device utilizing a bulk crystalline substrate.

FIG. 2 is a cross-section view through the fingers (34), (35), (36) and (37) of an input IDT such as IDT (20) in FIG. 1 and the portion of a bulk x-cut crystalline substrate of MTiOXO$_4$ (39) upon which it is deposited. Fingers (34) and (36) are charged while fingers (35) and (38) are grounded. The distance between adjacent fingers is equal to the width, d, of each of the fingers. It is evident that the direction of the electric field in the substrate between fingers (34) and (35) and between fingers (36) and (37) is opposite in direction to the electric field in the substrate between fingers (35) and (36).

Figure 3:
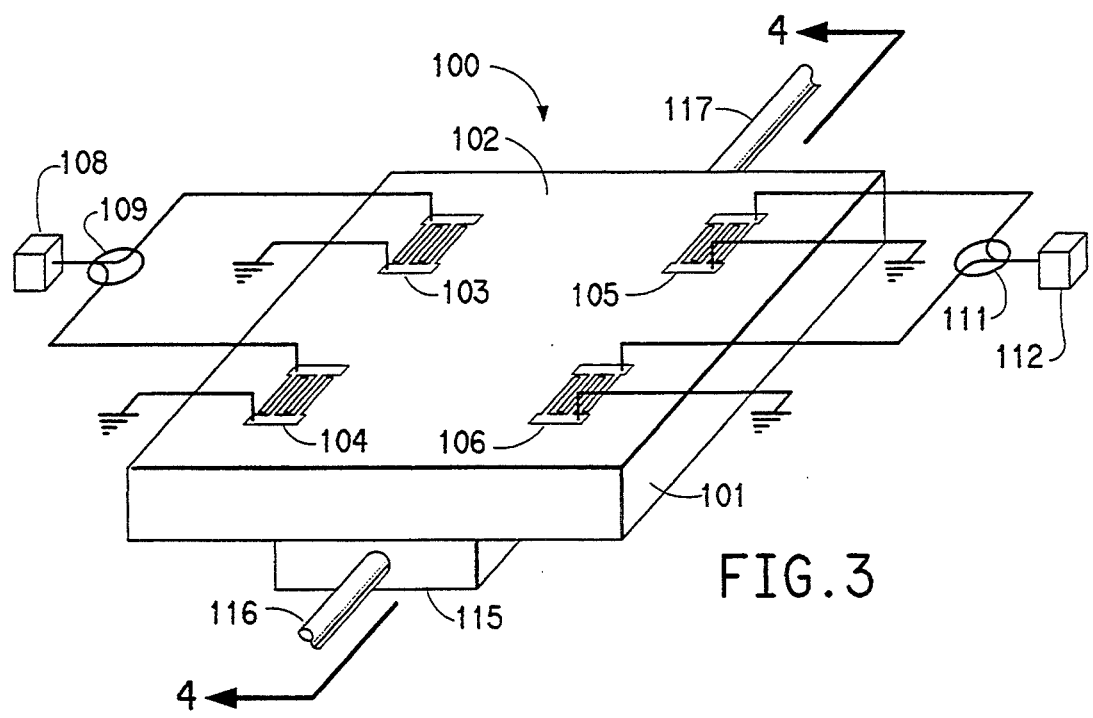
FIG. 3 is a schematic drawing of a liquid sensing device in accordance with this invention.

FIG. 3 illustrates a differential liquid sensing device in accordance with this invention. The device (100) has a KTP substrate with an x-cut planar surface (102) having two input IDTs (103) and (104) and two detecting IDTs (105) and (106) deposited thereon. Signals from signal source (108) are divided through splitter (109) and equally distributed to IDTs (103) and (104) to generate SSBWs respectively toward detecting IDTs (105) and (106). The detected signals from (105) and (106) are both directed to vector voltmeter (111) for electronic subtraction and the resulting signal is transmitted to monitoring device (112). The device (100) also includes a flow cell affixed to the x-cut reverse surface of the KTP substrate. A liquid input tube (116) and a liquid output tube (117) are provided to the flow cell (115).

Figure 4:
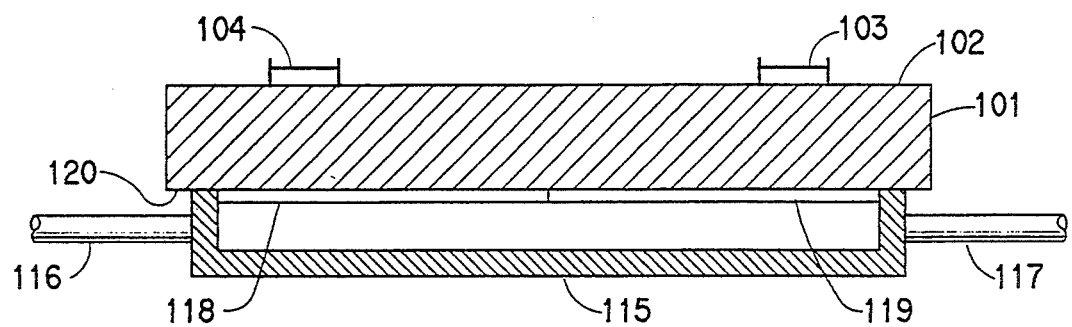
FIG. 4 is a cross-section through section 4—4 of the device of FIG. 3.

As illustrated in FIG. 4, the reverse surface (120) of the KTP substrate which forms one wall of the flow cell (115) has a first area beneath the path between IDTs (104) and (106) which is coated with a layer (118) of a first antibody, and a second area between the path between IDTs (103) and (105) which is coated with a layer (119) of a second antibody. In accordance with this invention, a liquid having an antigen that attaches to the first antibody, but not to the second antibody, is flowed through the flow cell as parallel SSBWs signals are transmitted between IDTs (103) and (105) and between IDTs (104) and (106). The device output as monitored at monitoring device (112) may be correlated with the antigen antibody attachment.

Practice of the invention is further illustrated by the following non-limiting examples.

EXAMPLE 1

Figure 5A:
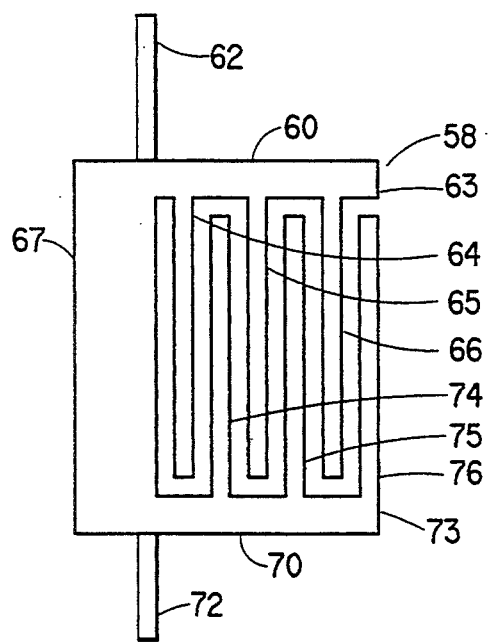
FIGS. 5a and 5b are schematic drawings of an IDT configuration including a signal receiving end IDT and a signal sending end IDT, respectively.

This example illustrates the generation of SSBWs on a flux-grown x-cut KTP crystal. A photomask was made to provide an IDT to receive an electric signal in accordance with the design shown (not to scale) at (58) in FIG. 5(a). The input IDT (58) had an electrode (60) with a connector portion (62), a top portion (63) and three fingers (64), (65) and (66) suitable for charging with a radio frequency electric signal; and an electrode (70) with a connector portion (72), a bottom portion (73) and three fingers (74), (75) and (76) suitable for grounding. Each of the fingers (64), (65), (66), (74), (75), and (76) was about 4 μm wide (and about 3000 μm long)

and the gap between adjacent fingers (e.g., between fingers (64) and (74)) was about 4 μm so as to generate SSBW waves. The gaps between the fingers (64), (65) and (66) and the bottom portion (73) as well as the gaps between the fingers (74), (75) and (76) and the top portion (63) were each about 10 μm. The input IDT (58) also had a grating portion (67) having about 300 strips about 4 μm in width and spaced about 4 μm apart suitable for reflecting surface SSBWs.

Figure 5B:
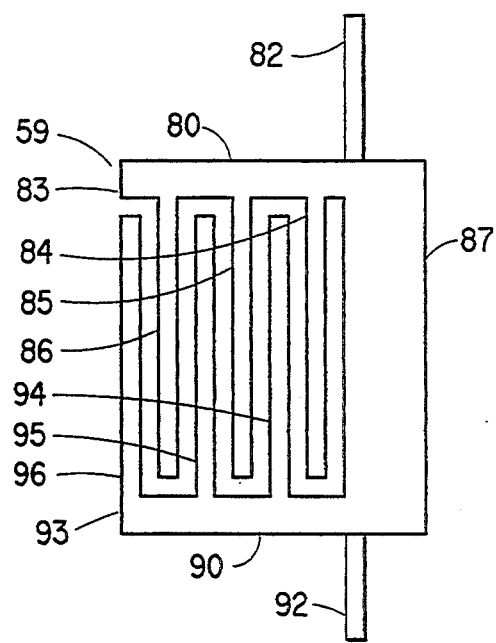

The photomask was also made to provide a signal detecting IDT in accordance with the design shown (not to scale) at (59) in FIG. 5(b). The detecting IDT (59) had an electrode (80) with a connector portion (82), a top portion (83), and three fingers (84), (85) and (86); and an electrode (90) with a connector portion (92), a bottom portion (93), and three fingers (94), (95) and (96). Each of the fingers (84), (85), (86), (94), (95) and (96) was about 4 μm wide, about 3000 μm long, and the gap between adjacent fingers (e.g., between fingers (84) and (94)) was about 4 μm. The gaps between the fingers (84), (85) and (86) and the bottom portion (93) as well as the gaps between the fingers (94), (95) and (96) and the top portion (83) were all about 10 μm. The detector IDT (59) also had a grating portion (87) having about 300 strips about 4 μm in width and spaced about 4 μm apart suitable for reflecting surface SSBWs toward the fingers (64), (65), (66), (74), (75) and (76).

IDTs (58) and (59) were deposited on the flux-grown x-cut KTP crystal about 0.8 mm thick in a conventional manner using the mask. The distance between two IDTs (58) and (59) was about 8 millimeters. An input signal of about 1 millivolt was used to generate SSBWs using a commercially available network analyzer. The transmission data for the device was monitored using the network analyzer, and showed a large and very wide bandwidth transmission peak center at 376.93 MHz. Since the surface wavelength is about 16 μm and the frequency is 376.93 MHz, the surface velocity of this mode, which is the SSBW, is calculated as about 6030 m/sec (using the relationship that the velocity is the product of the frequency and wavelength). The transmission data also showed that another much narrower bandwidth mode (only about ⅛ as wide as the SSBW), believed to be a conventional SAW, was generated simultaneously, shown by a peak center at about 227 MHz (about 3632 m/second velocity).

EXAMPLE 2

To further characterize the waves found in Example 1, the procedure of Example 1 was repeated, except that 20 μL of water was loaded onto the crystal substrate between the input and output IDTs. The conventional SAW, which originally appeared at about 227 MHz totally disappeared, whereas the SSBW, which originally appeared at 376.93 MHz, appeared at about 376.88 with a loss of signal strength of about 4.6 dB due to the water loading, clearly demonstrating the vibration in the planar surface mode (i.e., in the plane parallel to the surface of the crystal substrate).

EXAMPLE 3

The device tested in Example 2 was inverted such that the IDTs were located on the bottom surface of the x-cut substrate and 20 μL of water was loaded onto the x-cut top surface of the substrate, and the procedure of Example 2 was repeated. The conventional SAW changed very little from the SAW without liquid, whereas the SSBW which originally appeared at about 376.93 MHz, appeared at about 376.95 with a loss of signal strength of about 6 dB due to the water loading, clearly demonstrating deep penetration of SSBW waves.

What is claimed is:

1. A device for controlling high frequency signals by the generation of surface skimming bulk waves comprising:
   (a) a bulk crystalline substrate of $MTiOXO_4$ wherein M is selected from the group consisting of K, Rb, Tl, Cs, $NH_4$ and mixtures thereof and X is selected from the group consisting of P, As, and mixtures thereof having mm2 crystal symmetry and a planar-cut surface with a receiving area and a sending area;
   (b) an input interdigital transducer deposited on the signal receiving area of said substrate surface, suitable for connection to a source of electric signal and for inverse piezoelectrically generating in-plane polarized surface skimming bulk waves having a velocity within said bulk crystalline substrate of between about 4200 m/s and 7000 m/s;
   (c) a second interdigital transducer deposited on the signal sending area of said substrate surface suitable for piezoelectrically generating electric output signals from said surface skimming bulk waves; and
   (d) an electric signal responsive device which is operably connected to said second interdigital transducer and responds to said electric output signals.

2. The device of claim 1 wherein the bulk crystalline substrate is $KTiOPO_4$.

3. The device of claim 1 wherein the electric signal response device is a frequency controlling component of a cellular telephone.

4. The device of claim 3 wherein the bulk crystalline substrate is $KTiOPO_4$.

5. The device of claim 1 wherein the electric signal response device is a frequency controlling component of a cellular telephone operating within a bandwidth between about 900 and 2400 MHz.

6. The device of claim 5 wherein the bulk crystalline substrate is $KTiOPO_4$.

7. A method of controlling frequency of electric signals comprising: piezoelectrically converting said signals into surface skimming bulk waves having a velocity of between about 4200 m/s and 7000 m/s in a substrate of $MTiOXO_4$ wherein M is selected from the group consisting of K, Rb, Tl, Cs, $NH_4$ and mixtures thereof and X is selected from the group consisting of P, As, and mixtures thereof; and piezoelectrically detecting said surface skimming bulk waves from said substrate.

8. The method of claim 7 wherein the substrate is $KTiOPO_4$.

9. A method of fluid sensing, comprising: piezoelectrically converting input electric signals into surface skimming bulk waves having a velocity of between about 4200 m/s and 7000 m/s in a substrate of $MTiOXO_4$ wherein M is selected from the group consisting of K, Rb, Tl, Cs, $NH_4$ and mixtures thereof and X is selected from the group consisting of P, As, and mixtures thereof in contact with said fluid; and piezoelectrically detecting from said substrate surface skimming bulk waves which have been transmitted past said fluid.

10. The method of claim 9 wherein said crystalline substrate is $KTiOPO_4$ which is about 0.1 to 2 mm thick, wherein liquid is in contact with one side of said substrate, and wherein liquid sensing is accomplished on the reverse side.

* * * * *